(12) United States Patent
Bhaskarani

(10) Patent No.: US 8,400,181 B2
(45) Date of Patent: Mar. 19, 2013

(54) INTEGRATED CIRCUIT DIE TESTING APPARATUS AND METHODS

(75) Inventor: Sravan Kumar Bhaskarani, Bhadravathi (IN)

(73) Assignee: Advanced Micro Devices, Inc., Sunnyvale, CA (US)

( * ) Notice: Subject to any disclaimer, the term of this patent is extended or adjusted under 35 U.S.C. 154(b) by 486 days.

(21) Appl. No.: 12/769,325

(22) Filed: Apr. 28, 2010

(65) Prior Publication Data

US 2011/0234253 A1    Sep. 29, 2011

(30) Foreign Application Priority Data

Mar. 26, 2010   (IN) .............................. 821/CHE/2010

(51) Int. Cl.
    *G01R 31/00*      (2006.01)
(52) U.S. Cl. ......... 324/762.03; 324/765.01; 324/762.06; 324/762.01; 324/754.31; 324/754.21; 324/762.05; 714/727; 714/724; 714/726; 714/729; 714/733; 714/734
(58) Field of Classification Search ............. 324/762.03, 324/765.01, 762.06, 762.01, 754.31, 754.21, 324/762.05; 714/724, 726, 729, 733, 734, 714/727
See application file for complete search history.

(56) References Cited

U.S. PATENT DOCUMENTS

| | | | | |
|---|---|---|---|---|
| 3,492,572 A | * | 1/1970 | Jones et al. ................... | 714/740 |
| 5,526,365 A | * | 6/1996 | Whetsel ......................... | 714/726 |
| 5,606,566 A | * | 2/1997 | Whetsel ......................... | 714/729 |
| 5,677,915 A | * | 10/1997 | Whetsel ......................... | 714/726 |
| 5,687,312 A | * | 11/1997 | Whetsel ......................... | 714/28 |
| 5,969,538 A | | 10/1999 | Whetsel | |
| 6,006,343 A | * | 12/1999 | Whetsel ......................... | 714/28 |

(Continued)

FOREIGN PATENT DOCUMENTS

| | | |
|---|---|---|
| EP | 2088442 A1 | 12/2009 |
| EP | 2163910 A2 | 3/2010 |

OTHER PUBLICATIONS

Bahukudumbi et al., "Test-Length and TAM Optimization for Wafer-Level Reduced Pin-Count Testing of Core-Based SoCs", IEEE Transactions on Computer-Aided Design of Integrated Circuits and Systems, vol. 28, No. 1, Jan. 2009, pp. 111-120.*

(Continued)

*Primary Examiner* — Patrick Assouad
*Assistant Examiner* — Lamarr Brown
(74) *Attorney, Agent, or Firm* — Faegre Baker Daniels LLP

(57) ABSTRACT

A wafer is disclosed that includes a plurality of pipeline interconnected integrated circuit dies that form a plurality of pipelines. A plurality of dies in each pipeline is connected to receive scanned output test data from a neighboring die in a pipeline. A wafer level test access mechanism (TAM) transceiver circuitry, located outside the plurality of pipeline interconnected IC dies, is connected in common to each of the pipelines to provide input test data in a parallel fashion to the plurality of pipelines. The wafer level test access mechanism transceiver circuitry also provides output test results from each of the pipelines for evaluation by a computerized test system. In one embodiment, the wafer level test access mechanism transceiver circuitry is wireless so that it wirelessly receives test data to be passed through the multiple pipelines on a wafer and also includes wireless transmit circuitry to transmit test results from each of the pipelines. When on the wafer, the dies in a pipeline are interconnected with pipeline die test interconnection paths that provide pipeline test information interconnection among the plurality of dies in the pipeline.

20 Claims, 9 Drawing Sheets

U.S. PATENT DOCUMENTS

| | | | |
|---|---|---|---|
| 6,046,600 A | 4/2000 | Whetsel | |
| 6,131,172 A * | 10/2000 | Sowards | 714/718 |
| 6,262,587 B1 | 7/2001 | Whetsel | |
| 7,109,730 B2 * | 9/2006 | Slupsky | 324/754.21 |
| 7,155,646 B2 * | 12/2006 | Whetsel | 714/726 |
| 7,257,749 B2 * | 8/2007 | Whetsel | 714/726 |
| 7,281,183 B2 * | 10/2007 | Whetsel | 714/727 |
| 7,451,370 B2 * | 11/2008 | Whetsel | 714/727 |
| 7,516,378 B2 * | 4/2009 | Whetsel | 714/726 |
| 7,529,995 B2 * | 5/2009 | Whetsel | 714/727 |
| 7,574,641 B2 * | 8/2009 | Whetsel | 714/727 |
| 7,587,644 B2 * | 9/2009 | Whetsel | 714/729 |
| 7,598,728 B2 * | 10/2009 | Chung et al. | 324/756.07 |
| 7,657,806 B2 * | 2/2010 | Whetsel | 714/726 |
| 7,783,947 B2 * | 8/2010 | Whetsel | 714/727 |
| 7,890,825 B2 * | 2/2011 | Whetsel | 714/727 |
| 7,925,951 B2 * | 4/2011 | Whetsel | 714/733 |
| 7,962,812 B2 * | 6/2011 | Whetsel | 714/726 |
| 7,962,816 B2 * | 6/2011 | Whetsel | 714/727 |
| 8,010,857 B2 * | 8/2011 | Whetsel | 714/726 |
| 8,065,577 B2 * | 11/2011 | Whetsel | 714/727 |
| 8,095,839 B2 * | 1/2012 | Whetsel | 714/726 |
| 8,108,742 B2 * | 1/2012 | Whetsel | 714/727 |
| 8,108,744 B2 * | 1/2012 | Dubey et al. | 714/733 |
| 8,112,685 B2 * | 2/2012 | Whetsel | 714/732 |
| 8,115,507 B2 * | 2/2012 | Mizuno | 324/762.01 |
| 8,122,310 B2 * | 2/2012 | Whetsel | 714/726 |
| 8,276,030 B2 * | 9/2012 | Whetsel | 714/726 |
| 8,281,194 B2 * | 10/2012 | Whetsel | 714/726 |
| 8,296,614 B2 * | 10/2012 | Whetsel | 714/727 |
| 2002/0194563 A1 * | 12/2002 | Whetsel | 714/726 |
| 2003/0005380 A1 * | 1/2003 | Nguyen et al. | 714/736 |
| 2004/0006752 A1 * | 1/2004 | Whetsel | 716/4 |
| 2004/0168104 A1 * | 8/2004 | Whetsel | 714/28 |
| 2005/0125712 A1 * | 6/2005 | Co et al. | 714/718 |
| 2005/0251358 A1 * | 11/2005 | Van Dyke et al. | 702/117 |
| 2006/0066326 A1 * | 3/2006 | Slupsky | 324/753 |
| 2006/0282733 A1 * | 12/2006 | Whetsel | 714/741 |
| 2007/0011526 A1 * | 1/2007 | Whetsel | 714/726 |
| 2007/0089003 A1 * | 4/2007 | Whetsel | 714/726 |
| 2007/0241766 A1 * | 10/2007 | Kamitai et al. | 324/763 |
| 2008/0065939 A1 * | 3/2008 | Whetsel | 714/727 |
| 2008/0126892 A1 * | 5/2008 | Dubey et al. | 714/718 |
| 2008/0141088 A1 | 6/2008 | Parulkar et al. | |
| 2008/0244346 A1 * | 10/2008 | Poehl et al. | 714/729 |
| 2008/0278186 A1 | 11/2008 | Jung | |
| 2009/0193303 A1 | 7/2009 | Giles et al. | |
| 2009/0271672 A1 * | 10/2009 | Whetsel | 714/726 |
| 2009/0287973 A1 * | 11/2009 | Whetsel | 714/727 |
| 2010/0281317 A1 * | 11/2010 | Whetsel | 714/726 |
| 2010/0318863 A1 * | 12/2010 | Whetsel | 714/726 |
| 2010/0318866 A1 * | 12/2010 | Whetsel | 714/733 |
| 2011/0161761 A1 * | 6/2011 | Whetsel | 714/733 |
| 2011/0271160 A1 * | 11/2011 | Whetsel | 714/727 |
| 2012/0117434 A1 * | 5/2012 | Whetsel | 714/726 |
| 2012/0124438 A1 * | 5/2012 | Whetsel | 714/727 |
| 2012/0144254 A1 * | 6/2012 | Whetsel | 714/727 |
| 2012/0144255 A1 * | 6/2012 | Whetsel | 714/727 |
| 2012/0159275 A1 * | 6/2012 | Whetsel | 714/733 |
| 2012/0179945 A1 * | 7/2012 | Whetsel | 714/731 |
| 2012/0185742 A1 * | 7/2012 | Whetsel | 714/744 |
| 2012/0192022 A1 * | 7/2012 | Whetsel | 714/727 |
| 2012/0198291 A1 * | 8/2012 | Dubey et al. | 714/718 |
| 2012/0198295 A1 * | 8/2012 | Whetsel | 714/727 |

OTHER PUBLICATIONS

Jiang et al., "Test Architecture Design and Optimization for Three-Dimensional SoCs", Design, Automation & Test in Europe Conference & Exhibition, 2009, pp. 220-225.*

MacDonald et al., "200 Mb Wafer Memory", 1989 IEEE International Digest of Technical Papers 36 th ISSCC, pp. 240-242.*

International Search Report and Written Opinion from EP Patent Office; International Application No. PCT/US2011/029983; dated Jul. 4, 2011.

* cited by examiner

INTEGRATED CIRCUIT DIE TESTING APPARATUS AND METHODS

CROSS-REFERENCE TO RELATED APPLICATION

The present patent application claims priority from and the benefit of Indian Patent Application No. 821/CHE/2010, filed Mar. 26, 2010, and entitled INTEGRATED CIRCUIT DIE TESTING APPARATUS AND METHODS, which is hereby incorporated herein by reference.

BACKGROUND OF THE INVENTION

The disclosure relates generally to testing integrated circuit dies on wafers.

Wafers can contain many individual integrated circuit dies thereon. During the manufacturing process as part of the process, testing of the integrated circuit dies on a wafer is performed to detect defective integrated circuit dies on a wafer. One technique for performing wafer level testing is to contact each die with probes and a computer tester unit provides a set of patterns through the probes to each die. The test input stimulus can include functional and structural test patterns. The technique enables testing of all the dies on a wafer, but typically is done by probing each die individually one at a time. This can dramatically increase manufacturing time and cost and can wither die bumps that are used by the probes to make electrical contact with the die on the wafer.

Another proposal has been to include a wireless receiver and transmitter to communicate the test patterns and test results to provide contact list testing. However, such proposals employ a transmitter and receiver circuits in all of the dies on the wafer thus increasing the cost of each die.

A technique that attempts to reduce the wafer level test time is to use a multi-site testing approach wherein more than one die is simultaneously tested. This is typically done by the computer tester unit broadcasting the test stimulus, also referred to as input test data, to a specific subset of the die (8, 16 or 32 dies, for example) and comparing the outputs of all of these dies against the expected response. Such a multi-site testing technique typically requires broadcasting the stimulus to all of the dies simultaneously and comparing the responses of all the dies off-chip by the tester.

Accordingly, a need exists for an improved die structure, and testing system and method that addresses one or more of the above problems.

BRIEF DESCRIPTION OF THE DRAWINGS

The invention will be more readily understood in view of the following description when accompanied by the below figures and wherein like reference numerals represent like elements, wherein.

DETAILED DESCRIPTION OF THE PREFERRED EMBODIMENTS

Figure 1:
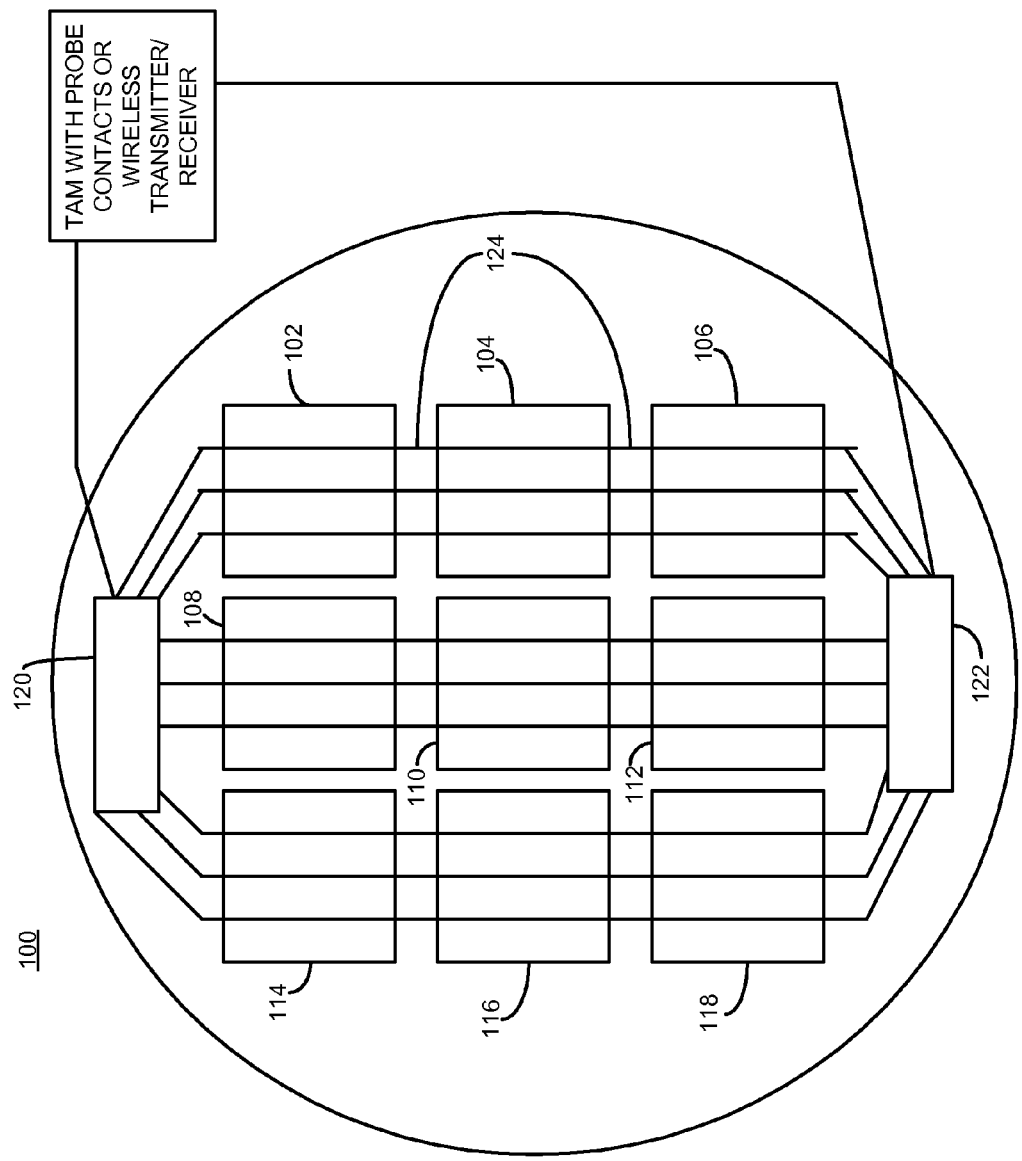
FIG. 1 is a diagram illustrating one example of a wafer in accordance with one of the disclosed embodiments.

Briefly, a wafer is disclosed that includes a plurality of pipeline interconnected integrated circuit dies that form a plurality of pipelines. A plurality of dies in each pipeline is connected to receive scanned output test data from a neighboring die in a pipeline. A wafer level test access mechanism (TAM) transceiver circuitry, located outside the plurality of pipeline interconnected IC dies, is connected in common to each of the pipelines to provide input test data in a parallel fashion to the plurality of pipelines. The wafer level test access mechanism transceiver circuitry also provides output test results from each of the pipelines for evaluation by a computerized test system. In one embodiment, the wafer level test access mechanism transceiver circuitry is wireless so that it wirelessly receives test data to be passed through the multiple pipelines on a wafer and also includes wireless transmit circuitry to transmit test results from each of the pipelines. When on the wafer, the dies in a pipeline are interconnected with pipeline die test interconnection paths that provide pipeline test information interconnection among the plurality of dies in the pipeline.

Among other advantages, the test access mechanism transceiver circuitry provides the ability to broadcast test stimulus with pipelining to all of the dies on a wafer. In addition, test responses of a die may be compared with its neighboring die to determine whether they match or not. In one example, each die has a match/mismatch bit that indicates by the end of the test whether its response matches with its neighbor's response. In case of a mismatch, further isolation may be performed to determine a defective die by directly observing one of the die. Among other advantages, a reduction in wafer level test time may occur, especially in a high yield scenario. The structure may also be backward compatible with conventional testing methods. The proposed techniques can reduce the time and cost it takes to perform wafer level testing.

In one example, each of the plurality of dies is coupled via the pipeline die interconnection paths, to receive scan input test data from a previous die, to provide scan output test data (also referred to as expected result data) for a subsequent die and to provide match/mismatch data to a subsequent die. Each of the dies may also include sticky bit logic that stores a sticky bit for retrieval by a JTAG based test interconnection when a mismatch occurs to indicate a defective die in a pipeline. Once individual dies within a pipeline are identified at the end of test as being defective, routing of additional test data may be provided via test probes or other suitable technique to retest the die if desired.

In one example, additional circuitry is employed in each die that includes, for example, test input selection logic that selectively provides test data from a previous IC die to internal logic under test. Comparator logic compares test data output from logic on the IC die with output test data from a previous die and may provide sticky bit information (such as a sticky bit) based on the comparison. Match/mismatch bit logic is also coupled to the comparator logic and to match/mismatch data from a previous die to output either a match or mismatch bit for a subsequent die indicating whether the previous die passed the test. In addition, pipeline flops may also be located on the dies and may be tested and replicated where necessary to serve as delay flops to provide suitable timing for passing information from one neighboring die to another neighboring die in a pipeline. In addition, a scan input port in the die provides the input test data and the scan input port may include a command port that provides command information during a test mode. Also neighbor die comparison bypass logic is employed to bypass on-die comparison of neighboring die scan output information.

FIG. 1 illustrates one example of a wafer 100 that includes a plurality of integrated circuit dies 102, 104 and 106 that are operatively coupled for test purposes in a pipeline fashion. Another set of IC dies 108, 110 and 112 are also connected in a pipeline manner for test purposes. A third set of dies 114, 116 and 118 are likewise connected in a pipeline fashion for test purposes. The plurality of sets of pipelined integrated circuit dies are coupled in parallel to wafer level test access mechanism (TAM) transceiver circuitry 120 and 122. The wafer level test access mechanism transceiver circuitry 120 and 122 is coupled to the plurality of pipelined IC dies, for example, to provide input test data to the plurality of pipelined IC dies and to receive test results on a per-wafer level from the pipelines. In this example, the wafer level TAM transceiver circuitry 120 is wafer level input data receive logic that receives test patterns, for example, via contact probes from a computer tester unit. The TAM transceiver circuitry portion 122 is wafer level output data transmit logic that outputs resulting test data to the computer tester unit. The plurality of pipelined IC dies 102-118 are located in between the wafer level input data receive logic 120 and the wafer level output data transmit logic 122 of the wafer level test access mechanism transceiver circuitry. The wafer level input data receive logic 120 and wafer level output data transmit logic 122 are located on a periphery of the wafer 100 and are not located in the dies 102-118. The wafer level input data receive logic 120 may also be thought of as transmitter logic that transmits test patterns in parallel to front end integrated circuit dies 102, 108 and 114. When the dies are cut out of the wafer after testing, the pipelines die test interconnection paths 124 between the dies are severed. As such, pipeline die test interconnection paths 124 provide pipeline interconnections among the plurality of dies 102, 104 and 106 in this example. It will be recognized that any suitable number of interconnections and dies may be employed on a wafer.

Figure 8:
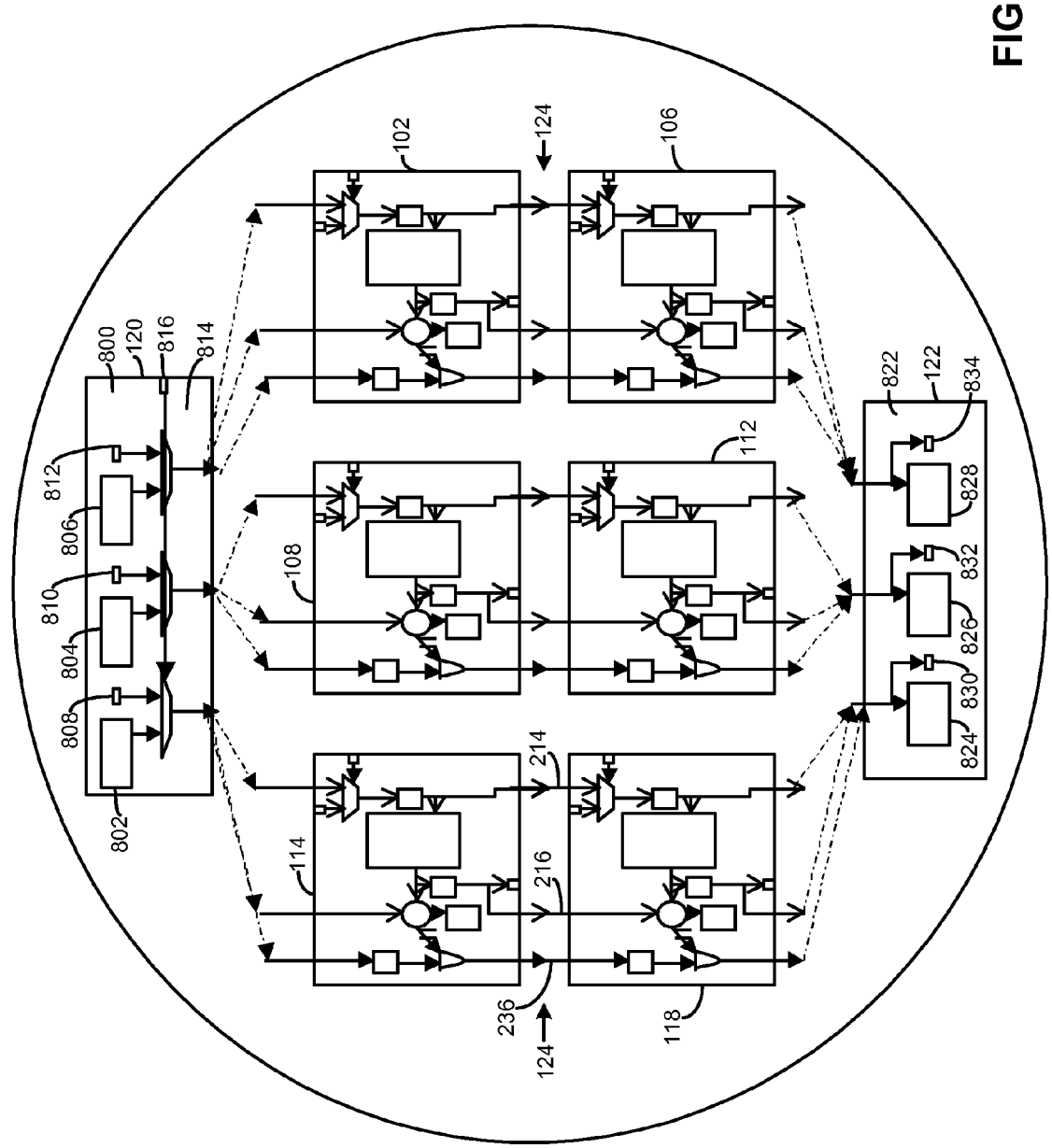
FIG. 8 is a diagram illustrating one example of a wafer in accordance with one embodiment set forth in the disclosure.

In an alternative embodiment, instead of using probe contacts, the wafer level test access mechanism transceiver circuitry 120 and 122 may include wireless transmitters and receivers to wirelessly receive and send communication to a computer based tester unit (see FIG. 8).

Figure 2:
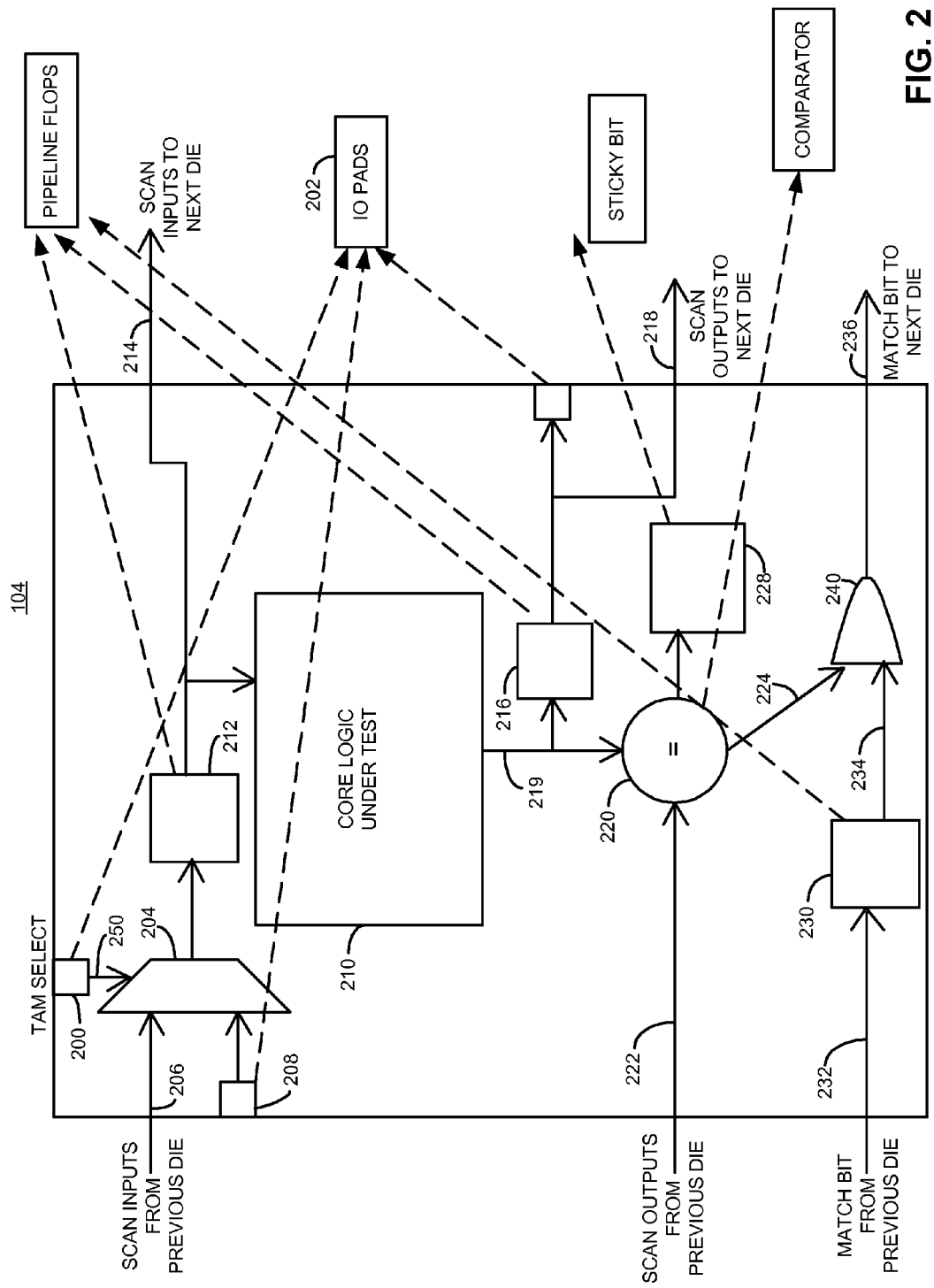
FIG. 2 is a block diagram illustrating one example of a die that is on a wafer in accordance with one embodiment set forth in the disclosure.

FIG. 2 illustrates one example of die 104. The die 104 includes a TAM select node 200 that is accessible via an input/output pad on the die shown as 202. The die 104 also includes test selection input logic 204 that, in one example, is a scanned input port that receives scanned input data from a previous die via scan input lines 206. Other inputs to the test selection input logic 204 may come from IO pads 202 via pad shown as 208. The test selection input logic 204 selectively provides test data also referred to as scan input data from the previous die (or directly from TAM 120 if it is the first die in the pipeline), to internal logic under test 210. In this example, pipeline flops 212 are included to provide input test data as scan input data to a subsequent die via interconnect paths shown as 214 and to the core logic 210. The pipeline flops 216 and 230 serve as delay compensation pipeline flops corresponding to pipeline flops 212.

The die 104 also includes a second set of pipeline flops 216 that provide scan output data to a subsequent die via interconnections shown as 218. In addition, the output of the second pipeline flops 216 are provided to the IO pads 202. The die also includes comparator logic 220 that compares test data output from the internal logic under test 210 with output test data 222 provided by a previous die. This is also referred to as scan outputs from a previous die. The comparator logic 220 provides a match/mismatch bit 224 to AND logic 226 and also provides a sticky bit 228 that may be read via a JTAG interface. In addition, a third set of pipeline flops 230 receive the match/mismatch bit from the previous die 232 and output the match bit information 234 to the AND logic 226. The match/mismatch bit logic 240, in this example AND logic, outputs at least one match/mismatch bit for a subsequent die shown as data 236.

In operation, the TAM select bit 250 is set by the tester via I/O pads 202 to set to select the wafer level TAM operation. Setting of this bit controls the test selection input logic 204 to receive scan inputs from a previous die instead of bits from I/O pads through pad 208. As such, the input test data is provided by the TAM 120 to the scan inputs and the first die and the pipeline sends the input data to the next die as shown as data 214 in a pipeline manner. The scan out data of each die 222 is compared via comparator logic 220 with that of the previous die and the output 224 is provided to the AND logic 240 and if a mismatch is detected, the sticky bit 228 is set. When the match occurs the match bit 224 is ANDED with the match bit 232 from previous dies. As set forth below, if masking is required to avoid comparison of the scanout data from a previous die when the expected values are unknown, mask registers via a JTAG interface may be set to mask the output data as shown for example in FIG. 3. The dies are tested in parallel because all of the pipelines are tested at the same time. Power and clock pins are directly connected at the die level (not shown) and as noted below, if a conventional test system is being employed, test patterns generated at the die level should be translated before applying to the wafer level so that a same test pattern is applied to all dies. As used herein "bit" can also refer to the structure that retains the bit such as a flop or register.

Figure 3:
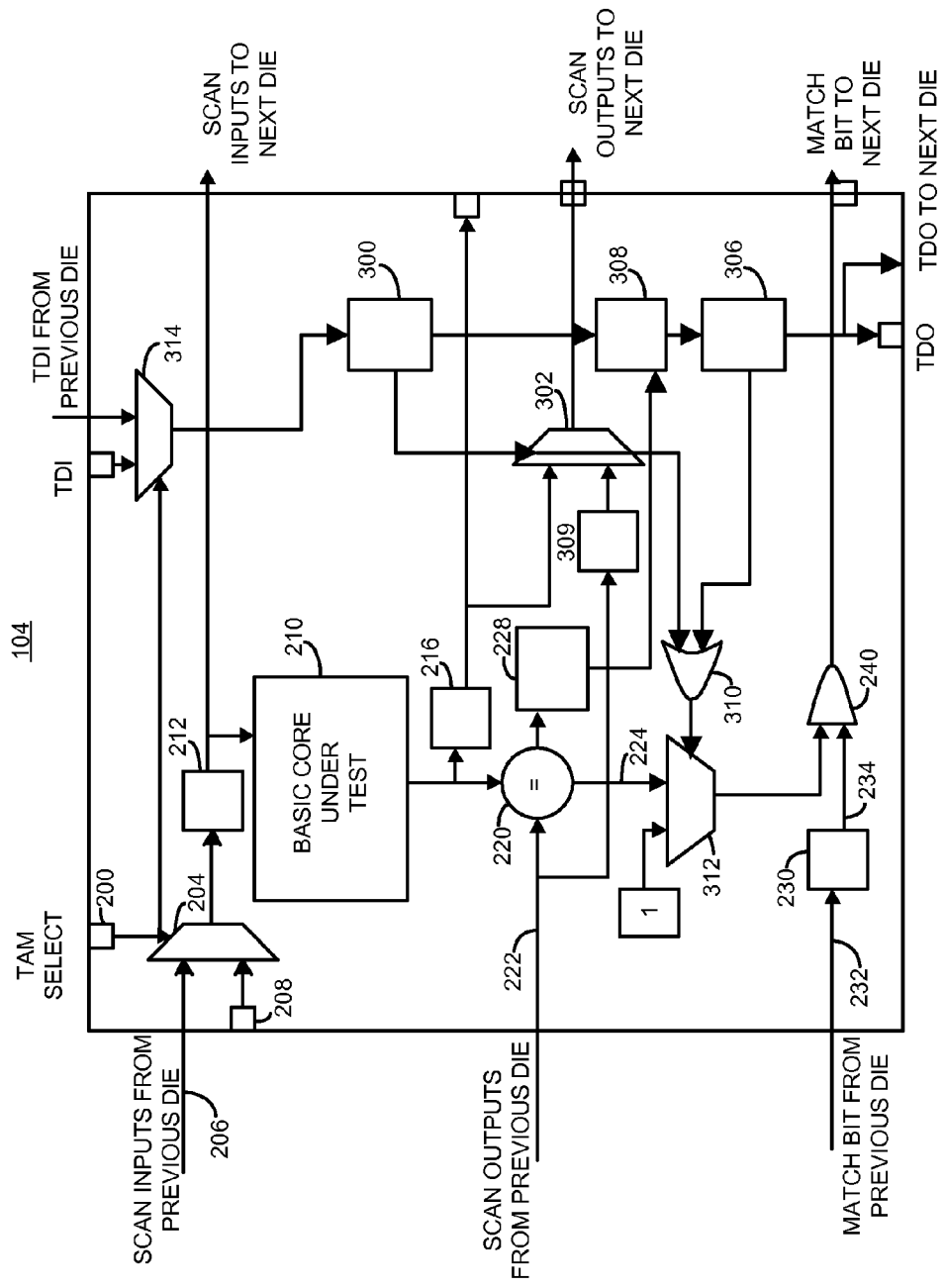
FIG. 3 is a block diagram illustrating one example of a plurality of dies on a wafer of the type shown in FIG. 2 and also illustrates sticky bits.

FIG. 3 illustrates additional logic used to allow a JTAG interface to select the die to be active versus bypassed in the pipeline, capture the sticky bit 228 that is set and bypass comparison circuitry 220 if the die is the first die in the pipeline or if the die is to be bypassed. Through JTAG register control, a die select bit 300 selects whether the die is to be active. For example, if the bit is set to a logical "1" the die may be indicated as active and becomes part of the dies in the pipeline that are tested. However, if the bit is set to 0, the bit serves as a select bit for multiplexer 302 to pass scan outputs from the previous die to bypass flops 216 and pass scan output data 222 from a previous die out of the die via flop 309. If the die select bit is set to bypass, the comparison is also bypassed as shown so that flop 309 captures the output data 222. The no-compare JTAG bit 306 may be set to a logical 1 if the die is a first die in the pipeline and sets as 0 for all other dies in the pipeline. This bit bypasses the comparison circuitry 220 since the first die does not compare outputs from previous die. The JTAG die failure sticky bit 308 causes the capture of the sticky bit data. As previously noted, the sticky bit is set to a 1 if there is a mismatch between the scanout data of the current die and the previous die. As shown, bore logic 310 controls multiplexer 312 during the mode where the die is the first die in the pipeline. The mux 314 selects between TDI and from a previous core or from an I/O pad if desired.

The sticky bit 228 (i.e., indicating a failure) is shifted out at the end of test along with other data via registers 300, 306 and 308. Although not shown, a multiplexer may be used to pass the data from the registers 300, 306 and 308 out the TDO port.

Figure 4:
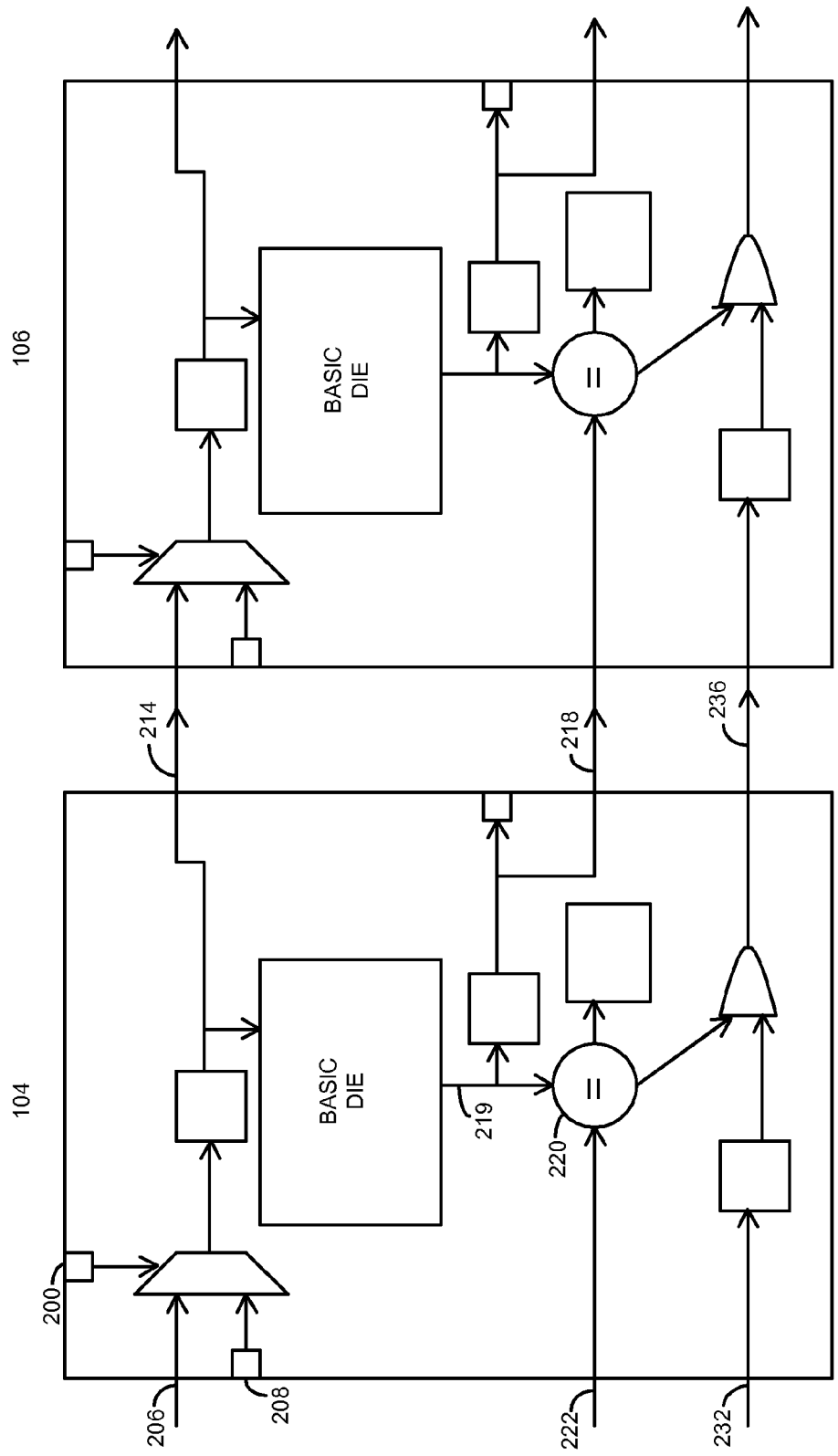
FIG. 4 is a block diagram illustrating one example of a plurality of dies on a wafer of the type shown in FIG. 2.
Figure 5:
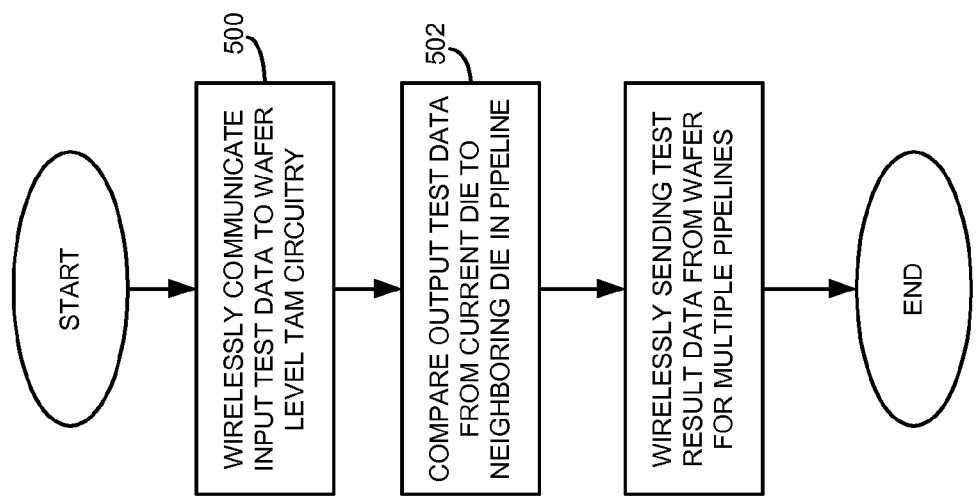
FIG. 5 is a flowchart illustrating one example of a method for testing a wafer in accordance with one embodiment set forth in the disclosure.

FIG. 4 shows interconnection of a plurality of dies 104 and 106. Die 106 and all of the dies on the wafer contain the same test support logic shown in FIG. 2 and therefore have not been renumbered. Referring to FIG. 4 and FIG. 5, in operation, each of the dies shown in FIG. 3 during testing operates as follows. In this example, the TAM includes wireless transmitters and receivers such as Bluetooth type short range wireless transmitter and receivers that communicate the test data to the wafer and the test results from the wafer. As shown, the method includes wirelessly communicating input test data to the wafer level TAM circuitry 120 as shown in block 500. As shown in block 502, the method includes comparing output test data from the current die to neighboring die in the pipeline. For example, the comparator 220 compares current test data from the die's core logic under test shown as data 219 with data 222 from a previous die as noted above. The method includes the TAM receiver circuitry 122 wirelessly sending test result data from the wafer for multiple pipelines. The TAM 122 collects data from the dies and transmits the information to the tester. Computer test system then evaluates the wafer level test data, translates the data into per-die level information to determine if, for example, a sticky bit has indicated that one of the dies has a different value from a previous die. If so, retesting using contact probes or wireless communication via the TAMs 120 and 122 allows for individual die testing to confirm failure. After the wafer is tested, the method includes separating the plurality of dies from the wafer using known techniques and terminating the pipeline die test interconnection points 124 as shown, for example, in FIG. 9 below. The JTAG bypass bit 304 is set to selectively bypass on-die comparison of neighboring die scan output information by a die within the pipeline of IC dies. Each die generates per-die match/mismatch information via the comparator 220 from within a pipeline of IC dies and passes the match bit to the next die. The mismatch information may be read through a JTAG interface or through other suitable mechanism. The wafer outputs the match or mismatch information to the TAM receiver 122 (this can also be referred to as a transmitter when taken from the perspective of the tester as it transmits data to the tester 120 and the tester can be referred to as a receiver as it receives the data transmitted by the TAM 122) which then wirelessly transmits it as wireless test result data. In addition, the scan output data is also provided. The method of operation also includes logically ANDing match bits from neighboring ICs in a pipeline to produce a result and determining a die failure based on the result. For example, if there are not matching bits from a die, then the sticky bit is set indicating a failure compared to a previous die.

The TAM select bit 200 during testing is selected to select the wafer TAM transceiver circuitry operation. The input test stimulus or test data is sent to each of the dies in a staggered manner since the output from one serves as the input to another. The scan output data of each die is compared with that of a previous die by the comparator. Whenever there is a mismatch, the sticky bit is set. A match bit is calculated per die and is ANDED with those of the other dies.

The scan input ports can also include command ports. Through the command ports, the die is commanded to load "mask" registers which mask the comparator operation. Masking is typically done to avoid comparison of the scanout data when the expected values are unknown.

It may be desirable to translate a test pattern for a single die into the wafer level patterns utilized by the TAM 120, accounting for pipelining of the scan data and operation of the TAM. For example, a translator need only translate the pattern data excluding any initialization sequence in a core level pattern. An initiation sequence can be crafted to set up the wafer to a state in which the die level patterns can be expected to work and in which the TAM is enabled to its desired mode. These patterns can be delivered to the tester as well and used with the translator pattern data to test the chip. To make the system backwards compatible with existing systems, it may be desirable to utilize a failure diagnosis system that collects the fail data to be reversed translated to the context of the die level pattern data. A reverse translation function may take a full wafer fail log as input and provide the corresponding equivalent die level fail data as output. This would be evident to one of ordinary skill in the art.

Also, depending upon the design and modeling of core logic in the die, each bit of scan observed data may not always be deterministically predictable. This means that the patterns produced for example, by the automatic tester may not have expected values calculated for every unload cycle of the die. For those bits of scan die that are undetermined, test tools commonly use the character "x" to indicate that it is unknown whether the data will be a logical value of 1 or 0. Some of the x bits may turn out to be different between different instantiations of identical dies. In this case, the comparators described above detect this difference and indicate disagreement between the dies in the match signal output and the sticky bits. It is undesirable for the comparators to flag a die disagreement for bit values that are expected to be unpredictable, so an additional feature described above allows the comparators to be masked for such bits. This is accomplished with a mask register that stores and feeds a mask pattern into the comparison logic to override an otherwise potentially miscomparing cycle of data. The mask register is arranged such that masking can be applied per channel and per cycle, permitting the desired x bits to be masked without unnecessarily masking additional known data. The mask register may be addressable via the JTAG interface. This mask, which is done on a per channel—per cycle basis, is done by commands as mentioned above. The JTAG mask register is used to mask the comparison in the first die if the first die is bypassed, then the mask bit of the second die should be set.

Figure 6:
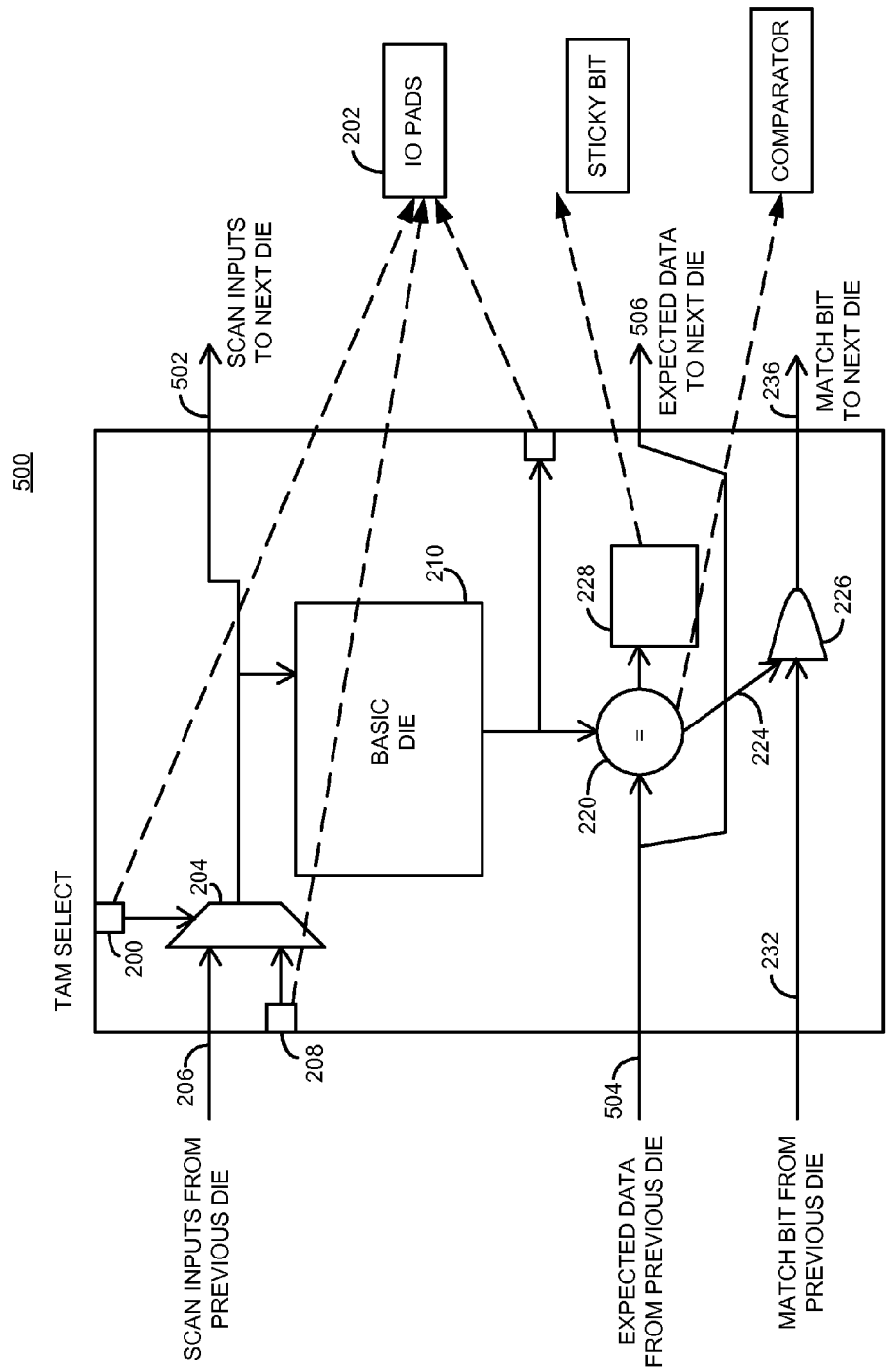
FIG. 6 is a block diagram illustrating another example of a die in accordance with another embodiment set forth in the disclosure.

FIG. 6 illustrates another example of a die 500, except in this configuration, the scan input data and the expected data is sent to all of the dies and no internal pipeline flops are used. The pipeline stages in each die are optional. In this example, the pipeline flops shown in FIG. 2 are not utilized. Instead, the scan input to the next die 502 are passed without going through pipeline flops 212. In addition, input to the comparator logic 220 is the expected data (also referred to as scan output) from the previous die 504. The data coming out of the basic die 210 is the scanout data. This data is not fed to subsequent dies. Instead it is fed only to the comparator and IO pad without any modification. The expected data from 504 is sent to 508. Thus data from 504 is referred to as scan output. In the implementation in prior discussions, the output of 302 ultimately comes from a basic core under test and that output is called scan out. The data from 504 is used as the expected data to the next die shown as 506. In this example, the scanout data is directly compared with the expected data. Whenever there is a mismatch, the sticky bit 228 is set. A match bit is calculated per die and is ANDED with those of the other dies as previously noted.

As to the expected data, each expected data value in this example consists of two bits. A "00" represents a value "0", a "11" represents a value "1", and a value "01" indicates that the expected value is an unknown "X". Whenever the expected data is designated "X", no comparison is done by the comparator 220. As noted above, all dies are tested in parallel.

Figure 7:
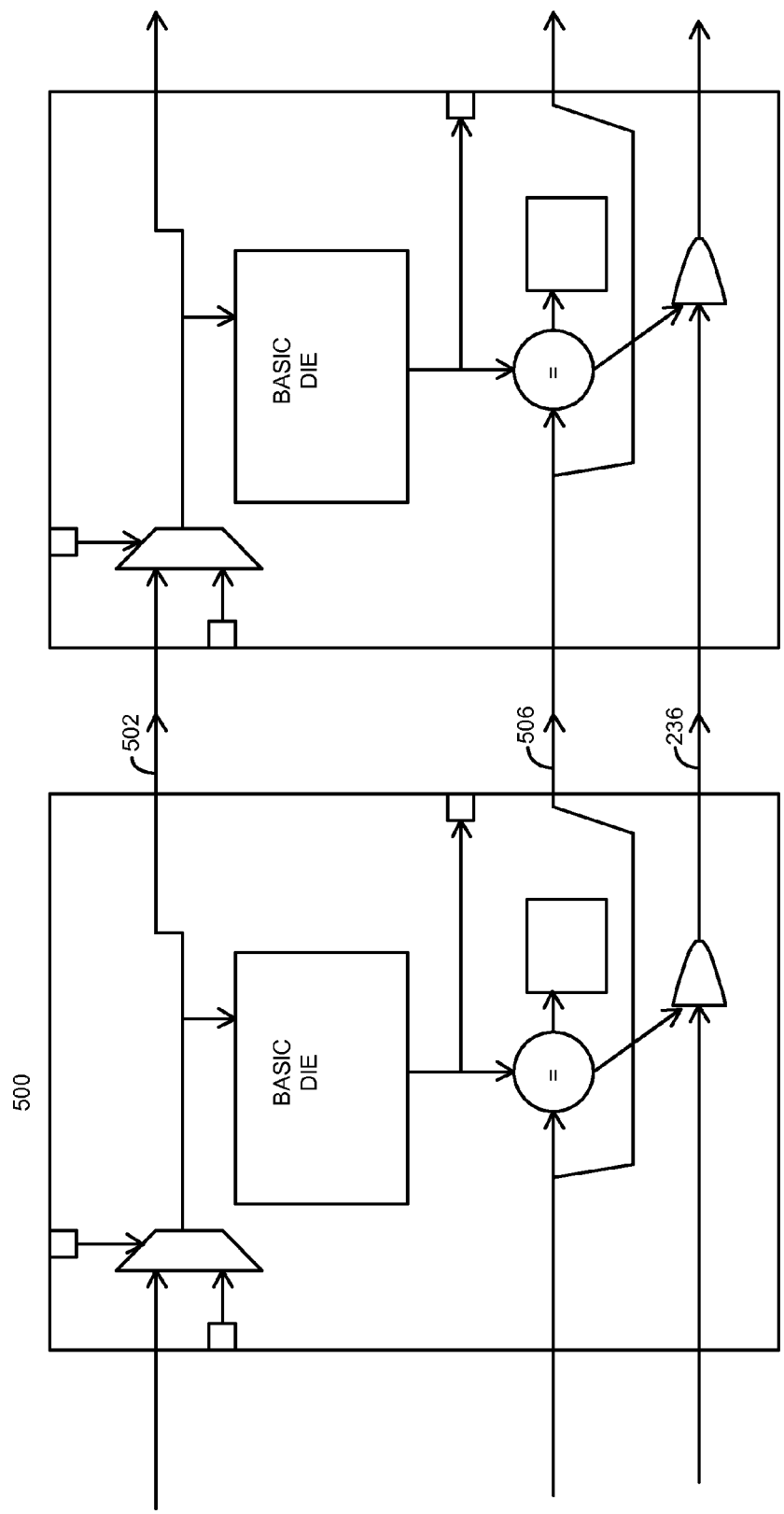
FIG. 7 is a block diagram illustrating a plurality of die of the type shown in FIG. 5 on a wafer in accordance with one embodiment set forth in the disclosure.

FIG. 7 illustrates the interconnection of a plurality of dies similar to those dies shown in 500 and are interconnected through wafer level interconnections as shown.

A method of operation of the test operation using the die shown in FIGS. 6 and 7 includes setting a select bit to select the wafer TAM. The scan input data and the expected data is sent by the computer based tester unit to all dies. The scanout data from the logic under test 210 is compared by the comparator 220 directly with expected data from a previous die 504. Whenever there is a mismatch, the sticky bit 228 is set. A match bit/mismatch bit 224 is ANDED with those of other dies by AND logic 226. As noted, the expected data value computes 2 bits.

Referring to FIG. 8, the wafer level test access mechanism transceiver circuitry 120 is shown in this example to be a wireless receiver module that includes a wireless receiver 802, 804 and 806 corresponding to each of the plurality of pipelines of integrated circuit dies. The wireless receivers 802-806 may be, for example, Bluetooth type wireless receivers, optical wireless receivers or any other suitable wireless receiver. The receiver module 800 also includes scan input pads 808, 810 and 812 that are coupled to input/output nodes that may be used when input test data is to be used without the wireless receivers. A multiplexing structure 814 is controllable to pass test input data either from the wireless receivers 802-806 or the scan inputs from the I/O pads 808-812 under control of an input/output select signal 816 provided by the tester.

The wafer level test access mechanism transceiver circuitry 122 is shown to be a corresponding wireless transmitter module 822 that includes a plurality of wireless transmitters 824, 826 and 828 to wirelessly communicate test result information from each of the plurality of pipelines to a computer test system. They may also be Bluetooth type transmitters or any other suitable wireless transmitters. In a non-wireless mode of operation, scan output pads 830, 832 and 834 may be contacted via contact probes to receive the output test data from each of the plurality of pipelines. As such, input scan data (input test data) can be sent to the die either through the I/O pads or wirelessly through the receive module and the output scan data can be collected either through the I/O pads or wirelessly through the transmit module.

Figure 9:
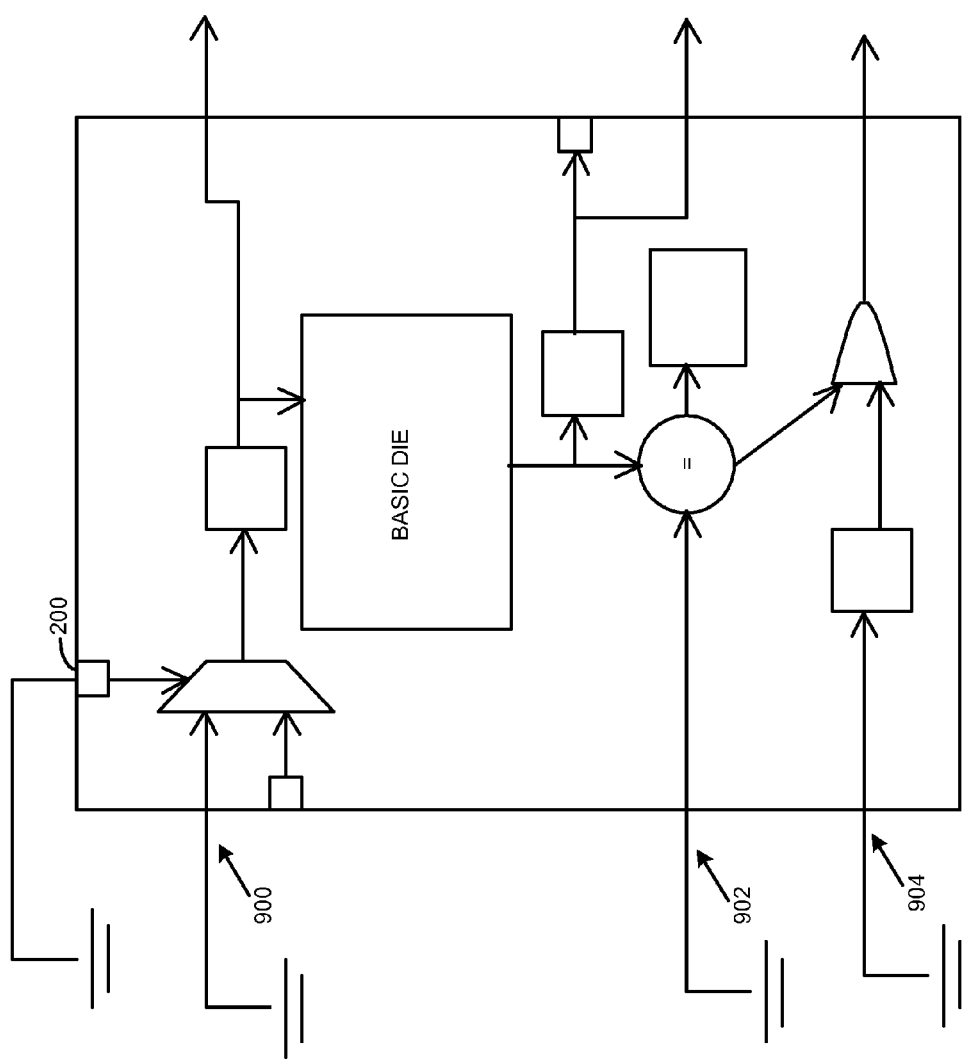
FIG. 9 is a diagram illustrating a terminated die after packaging.

FIG. 9 illustrates one example of the die once they are removed from the wafer. The TAM specific pins in this example are terminated by connecting the nodes to a ground potential. These nodes are shown as nodes 200, 900, 902 and 904. The nodes 904 and 902 carry, for example, the match bit from a previous die and scanout data or expected data from a previous die. Node 900 provides the scan inputs from a previous die.

A method of testing a wafer containing a plurality of integrated circuits set forth herein includes communicating input test data to a wafer that includes the wafer level test access mechanism transceiver circuitry located outside the plurality of IC dies. The TAM transceiver circuitry is coupled to each of the plurality of IC dies to provide input test data in parallel to multiple pipelines. A computer based tester unit receives wafer level test result data from the wafer in response to communication of the input test data to the wafer. The method also includes separating the plurality of dies from the wafer using any known die cutting or separation techniques and terminating the wafer level test access mechanism transceiver circuitry and other transceiver circuitry as shown in FIG. 9. This may be done when the die is placed in a package if desired. This may also occur when the package is placed on a substrate. Communicating the input test data to the wafer and receiving wafer level test result data back may be done wirelessly using known wireless communication circuitry.

Among other advantages, the test access mechanism transceiver circuitry provides the ability to broadcast test stimulus with pipelining to all of the dies on a wafer. In addition, test responses of a die may be compared with its neighboring die to determine whether they match or not. In one example, each die has a match/mismatch bit that indicates by the end of the test whether its response matches with its neighbor's response. In case of a mismatch, further isolation may be performed to determine a defective die by directly observing one of the die. Among other advantages, a reduction in wafer level test time may occur, especially in a high yield scenario. The structure may also be backward compatible with conventional testing methods. The proposed techniques can reduce the time and cost it takes to perform wafer level testing.

Also, integrated circuit design systems (e.g. work stations) are known that create wafers with integrated circuits based on executable instructions stored on a computer readable memory such as but not limited to CDROM, RAM, other forms of ROM, hard drives, distributed memory etc. The instructions may be represented by any suitable language such as but not limited to hardware descriptor language or other suitable language. As such, the logic (e.g., circuits) described herein may also be produced as integrated circuits by such systems. For example a wafer with the aforedescribed logic and transmitters and receivers may be created using such integrated circuit fabrication systems.

The above detailed description of the invention and the examples described therein have been presented for the purposes of illustration and description only and not by limitation. It is therefore contemplated that the present invention cover any and all modifications, variations or equivalents that fall within the spirit and scope of the basic underlying principles disclosed above and claimed herein.

What is claimed is:

1. A wafer comprising:
   a plurality of pipeline interconnected integrated circuit (IC) dies, a plurality of dies in each pipeline being connected to receive scanned output test data from a neighboring die;
   wafer level test access mechanism (TAM) transceiver circuitry located outside the plurality of pipeline interconnected IC dies, operatively coupled to each of the pipelines of IC dies to provide input test data in a parallel fashion to the plurality of pipelines and to provide test results from each of the pipelines.

2. The wafer of claim 1 comprising pipeline die test interconnection paths that provide pipeline test information interconnection among the plurality of dies in a pipeline, each of the plurality of dies coupled, via the pipeline die interconnection paths, to receive scan input test data from a previous die, to provide scan output test data for a subsequent die and to provide match/mismatch data to the subsequent die.

3. The wafer of claim 1 wherein each of the IC dies comprises:
   test input selection logic operative to selectively provide test data from a previous IC die to internal logic under test;
   comparator logic operative to compare test data output from logic on the IC die with output test data from a previous die and to provide sticky bit information based on the comparison;

match/mismatch bit logic operatively coupled to the comparator logic and to match/mismatch data from a previous die and operative to output at least one match/mismatch bit for a subsequent die.

4. The wafer of claim 3 wherein each of the IC dies comprises:
a first set of pipeline flops to provide the input test data as scan input data to a subsequent die;
a second set of pipeline flops that provide scan output data to the subsequent die; and
a third set of pipeline flops operatively coupled to receive match data from a previous die.

5. The wafer of claim 3 wherein the test selection input logic comprises multiplexer logic having an input coupled to receive test input data from a previous die, a TAM select input operatively coupled to at least a first input/output pad of the IC die and an input operatively coupled to at least a second input output pad of the IC die and an output operatively coupled to pipeline logic in the IC die, the output operatively coupled a subsequent die.

6. The wafer of claim 1 wherein the plurality of pipelines of IC dies are located in between wafer level input data receive logic and wafer level output data transmit logic of the wafer level test access mechanism (TAM) transceiver circuitry and wherein the wafer level input data receive logic and wafer level output data transmit logic are located on a periphery of the wafer.

7. The wafer of claim 6 wherein each of the plurality of dies comprises a scan input port that provides the input test data and wherein the scan input port comprises a command port that provides command information during a test mode.

8. The wafer of claim 1 comprising sticky bit capture logic and neighbor die comparison bypass logic operative to bypass on die comparison of neighboring die scan output information.

9. A wafer comprising:
a plurality of pipeline interconnected integrated circuit (IC) dies, a plurality of dies in each pipeline being connected to receive scanned output test data from a neighboring die;
wireless wafer level test access mechanism (TAM) transceiver circuitry located outside the plurality of pipeline interconnected IC dies, operatively coupled to each of the pipelines of IC dies to provide input test data in a parallel fashion to the plurality of pipelines and to wirelessly provide test results from each of the pipelines.

10. The wafer of claim 9 comprising pipeline die test interconnection paths that provide pipeline test information interconnection among the plurality of dies in a pipeline, each of the plurality of dies coupled, via the pipeline die interconnection paths, to receive scan input test data from a previous die, to provide scan output test data for a subsequent die and to provide match/mismatch data to the subsequent die.

11. The wafer of claim 9 wherein each of the IC dies comprises:
test input selection logic operative to selectively provide test data from a previous IC die to internal logic under test;
comparator logic operative to compare test data output from logic on the IC die with output test data from a previous die and to provide sticky bit information based on the comparison;
match/mismatch bit logic operatively coupled to the comparator logic and to match/mismatch data from a previous die and operative to output at least one match/mismatch bit for a subsequent die.

12. The wafer of claim 11 wherein the test selection input logic comprises multiplexer logic having an input coupled to receive test input data from a previous die, a TAM select input operatively coupled to at least a first input/output pad of the IC die and an input operatively coupled to at least a second input output pad of the IC die and an output operatively coupled to pipeline logic in the IC die, the output operatively coupled a subsequent die.

13. The wafer of claim 9 wherein the plurality of pipelines of IC dies are located in between wafer level input data receive logic and wafer level output data transmit logic of the wafer level test access mechanism (TAM) transceiver circuitry and wherein the wafer level input data receive logic and wafer level output data transmit logic are located on a periphery of the wafer.

14. The wafer of claim 9 comprising sticky bit capture logic and neighbor die comparison bypass logic operative to bypass on die comparison of neighboring die scan output information.

15. A system for testing wafers containing integrated circuit (IC) dies comprising:
a computer based tester unit operative to provide input test data to a wafer under test and to obtain output test result data from the wafer under test;
the wafer under test comprising a plurality of pipeline interconnected integrated circuit (IC) dies, a plurality of dies in each pipeline being connected to receive scanned output test data from a neighboring die; and wafer level test access mechanism (TAM) transceiver circuitry located outside the plurality of pipeline interconnected IC dies, operatively coupled to each of the pipelines of IC dies to provide input test data in a parallel fashion to the plurality of pipelines and to provide test results from each of the pipelines.

16. A method of testing a wafer containing a plurality of integrated circuit (IC) dies comprising:
wirelessly communicating input test data to a wafer comprising wafer level test access mechanism (TAM) transceiver circuitry located outside a plurality of pipelined IC dies to provide input test data to the plurality of pipelines of IC dies in a parallel fashion;
comparing output test data from a current die under test to a neighboring die in a pipeline; and
wirelessly sending test result data from the wafer in response to the communication of the input test data.

17. The method of claim 16 comprising separating the plurality of dies from the wafer and terminating a pipeline die test interconnection points that provide pipeline test information interconnection among the plurality of dies during testing.

18. The method of claim 16 comprising selectively bypassing on die comparison of neighboring die scan output information by at least one die within a pipeline of IC dies.

19. The method of claim 16 comprising generating per die match/mismatch information from within a pipeline of IC dies and outputting the match/mismatch information as part of the wireless test result data.

20. The method of claim 16 comprising logically ANDing match bits from neighboring IC dies in a pipeline to produce a result and determining a die failure based on the result.

* * * * *